(12) United States Patent
Wing et al.

(10) Patent No.: US 6,277,235 B1
(45) Date of Patent: Aug. 21, 2001

(54) IN SITU PLASMA CLEAN GAS INJECTION

(75) Inventors: James C. Wing, Los Altos; Edward J. McInerney, San Jose, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/132,688

(22) Filed: Aug. 11, 1998

(51) Int. Cl.⁷ .............................. H05H 1/00; C23C 16/00
(52) U.S. Cl. .......................... 156/345; 118/728; 118/723
(58) Field of Search ............................ 156/345; 118/728, 118/723, 715, 732

(56) References Cited

U.S. PATENT DOCUMENTS

| | | | |
|---|---|---|---|
| 4,709,655 | 12/1987 | Van Mastrigt | 118/719 |
| 4,999,320 | * 3/1991 | Douglas | 438/715 |
| 5,203,958 | * 4/1993 | Arai et al. | 156/643 |
| 5,308,950 | 5/1994 | Ramm et al. | 219/121.43 |
| 5,542,559 | * 8/1996 | Kawakami et al. | 216/67 |
| 5,679,215 | 10/1997 | Barnes et al. | 156/646.1 |
| 5,698,062 | * 12/1997 | Sakamoto et al. | 156/345 |
| 5,900,103 | * 5/1999 | Tomoyasu et al. | 156/345 |
| 5,997,687 | * 12/1999 | Koshimizu | 156/345 |
| 6,035,803 | * 3/2000 | Robles et al. | 118/723 E |

* cited by examiner

Primary Examiner—Gregory Mills
Assistant Examiner—P. Hazzanzadeh
(74) Attorney, Agent, or Firm—Skjerven Morrill MacPherson LLP; David E. Steuber; Michael J. Halbert

(57) ABSTRACT

A processing chamber with a showerhead and a chuck is cleaned using an injection of a gaseous cleaning agent through an aperture in the chuck into the processing chamber. Because the aperture is located directly under the showerhead, a portion of the gaseous cleaning agent passes through the face plate of the showerhead so that the inside of the showerhead may be cleaned as well. By applying a radio frequency power supply between the chuck and the showerhead, for example, by a coil located between the chuck and showerhead or applying the power directly to the chuck and the showerhead, the gaseous cleaning agent forms a plasma. Thus, the portion of the gaseous cleaning agent that passes through the face plate and into the showerhead is a plasma. The plasma is pumped out of the chamber through a pumping port so that the plasma continuously flows through the processing chamber.

15 Claims, 3 Drawing Sheets

IN SITU PLASMA CLEAN GAS INJECTION

FIELD OF THE INVENTION

The present invention relates to chemical vapor deposition processing chambers and in particular to removing unwanted material from the surfaces within a processing chamber.

BACKGROUND

Processing chambers, such as chemical vapor deposition ("CVD") chambers are used to process work pieces, such as semiconductor wafers, light crystal diodes, flat panel displays, or other similar substrates. During processing, a substrate located within the processing chamber is exposed to reactive gases introduced into the chamber and the substrate has material deposited on it. During the processing of the substrate, the inside surfaces of the chamber itself are typically contaminated by residual deposited material. Thus, in subsequent processing of substrates within the contaminated chamber, unwanted particles may form when the reactive gases combine with the contamination on the chamber's surfaces and the particles may be deposited on the substrate. Thus, processing chambers must be periodically cleaned to avoid the contamination of the substrates being processed.

Typically, processing chambers are in situ (automatically) cleaned using a gaseous cleaning agent, activated with a plasma. In conventional processing chambers, the cleaning agent gas is introduced into the processing chamber in the same manner as the reactive gases are introduced during processing, e.g., through a gas inlet port, such as a showerhead. Conventional processing chambers typically include a chuck that supports the substrate and is positioned under the showerhead. During processing, the reactive gases flow out of the showerhead and over the substrate located on the chuck. The unused reactive gases are then pumped out of the chamber through an exhaust port. Similarly, during a cleaning cycle, the gaseous cleaning agent flows out of the showerhead and over the chuck. The gaseous cleaning agent is then pumped out of the chamber through the exhaust port. Thus, the gaseous cleaning agent has approximately the same flow pattern as the reactive gas. As the gaseous cleaning agent is pumped through the chamber, the gaseous cleaning agent contacts the chamber's interior surfaces and reacts with the contaminants on the chamber's surfaces to create a gaseous by-product, i.e., vapor, and particles of the contaminant. The vapor and particles of the contaminant are then pumped out of the chamber along with the remaining gaseous cleaning agent through the exhaust port.

Where the cleaning process uses a plasma, radio frequency (RF) power is provided within the processing chamber, forming a plasma to ionize the cleaning agent gas to enhance chemical reaction with the contamination on the chamber's interior surfaces. The RF power is typically applied between the showerhead and the chuck. Thus, the gaseous cleaning agent does not form a plasma until the gas has flowed out of the showerhead and into the RF field.

Unfortunately, contamination of the chamber can occur not only on the walls and chuck of the chamber, but also on the interior walls of the showerhead. This is particularly true where a non-plasma type process is being used, such as a parylene process. There are many forms of parylene, such as parylene C, parylene N, and parylene AF4, by way of example. Parylene AF4 is the form best suited and, thus, typically used for VLSI semiconductor devices. Parylene polymer is a dielectric material that will deposit on surfaces below 50° C. During processing, parylene is often deposited on the interior walls of the showerhead. Other CVD processing chambers, such as tungsten, titanium nitride, or similar non-plasma processes, can also undergo undesirable deposition of the material within the showerhead.

Cleaning a parylene processing chamber, or other such processing chamber, with a plasma activated cleaning agent does not adequately clean the interior of the showerhead. Consequently, the interior of the showerhead has to be replaced or periodically cleaned manually, thereby increasing deposition tool downtime. Consequently, the overall throughput of the deposition tool is decreased.

Thus, an in situ plasma clean is needed for processing chambers that can clean the interior surfaces of the chamber including the interior of the showerhead.

SUMMARY

A processing chamber includes a showerhead and a chuck. The face plate of the showerhead facing the chuck has a pattern of small holes. The chuck has a central aperture connected to a gaseous cleaning agent supply. The gaseous cleaning agent, such as Oxygen, flows through the chuck aperture into the processing chamber. Because the chuck aperture is located below the showerhead, a portion of the gaseous cleaning agent flows through small holes in the showerhead face plate to the interior of the showerhead. The gaseous cleaning agent circulates within the showerhead and back out through the holes in the showerhead face plate. A pumping (exhaust) port located downstream of the chuck pumps the gaseous cleaning gas out of the processing chamber. A radio frequency power supply is provided to the chuck and the showerhead, forming an electromagnetic field (plasma) between the chuck and showerhead. The gaseous cleaning agent is ionized as it passes through the electromagnetic field. Thus, the portion of the gaseous cleaning agent that flows into the showerhead via the face plate is in the form of an ionized gas.

An in situ plasma clean is provided by pumping any remaining gas out of the processing chamber until the chamber is at a base pressure, e.g., below 10 mTorr. The gaseous cleaning agent then flows into the chamber through the aperture in the chuck. The pumping port pumps the gaseous cleaning agent and other reactant gases out of the chamber to maintain a constant pressure and a continuous supply of the gaseous cleaning agent. By applying the radio frequency power and forming a plasma, the gaseous cleaning agent passing through the plasma is ionized, which effectively chemical reactant cleans the processing chamber, including inside the showerhead. The gaseous cleaning agent supply is turned off and a purging gas flows into the processing chamber, e.g., from the showerhead, while the pumping port continues to pump gas out of the chamber. The purging gas supply is shut off and the pumping port pumps out the remaining gas until the chamber is again at its base pressure. Processing within the chamber can then be recommenced. Advantageously, the plasma clean is automatically performed without opening the processes chamber to atmosphere and with a minimal downtime.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
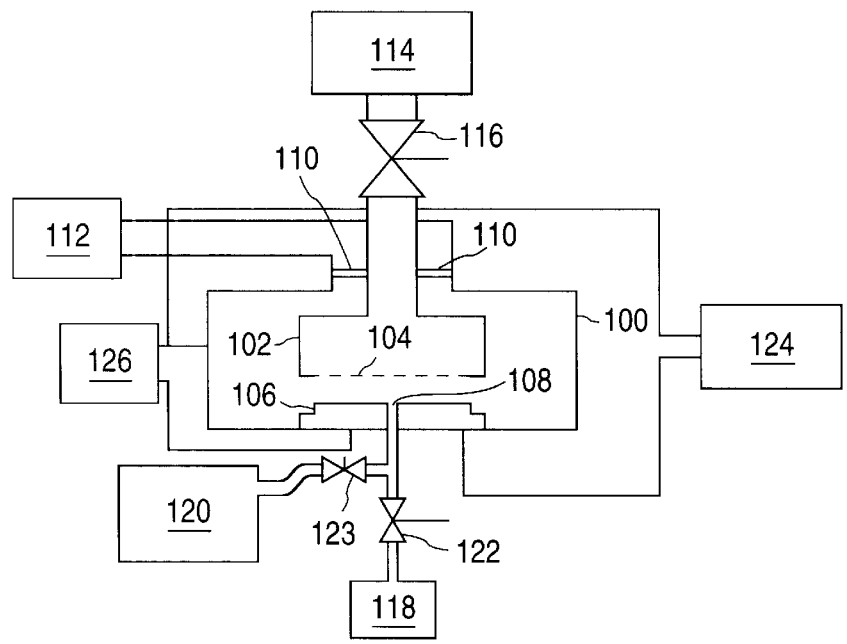
FIG. 1 is a schematic diagram of a processing chamber, including a gas inlet showerhead with face plate, a chuck with an aperture, and an annular pumping port.

FIG. 1 is a schematic diagram of a processing chamber 100, including a gas inlet showerhead 102 with face plate 104, a chuck 106, and an annular pumping port 110. Annular pumping port 110 is connected to a vacuum pump 112 that is used to pump gas out of chamber 100. Showerhead 102 is connected to a reactive gas source 114 via valve 116. Chuck 106 includes at least one aperture 108 that is connected to a gas source 118 by way of a valve 122. Aperture 108 is centrally located in the surface of chuck 106. Gas source 118 supplies a gas to the back side of a substrate located on chuck 106 via aperture 108 during substrate processing. Aperture 108 is also connected to a cleaning gas source 120 by way of a valve 123. During cleaning there is no substrate located on chuck 106, and thus the cleaning gas flows unimpeded into chamber 100.

Showerhead 102 and chuck 106 are also electrically connected to an RF power source 124, such that chuck 106 and showerhead 102 act as an anode and cathode, respectively. Chamber 100 may alternatively be connected to RF power source 124 by a coil located between chuck 106 and showerhead 102. In addition, temperature control elements are connected to chamber 100, including chuck 106, showerhead 102, and the walls of chamber 100. The temperature control elements are controlled by temperature controller 126.

During normal processing operations, a substrate (not shown), such as a semiconductor wafer, is automatically loaded into chamber 100 by an automatic transportation mechanism (not shown). The substrate is then clamped to chuck 106 using an electrostatic charge, a mechanical clamp, a vacuum clamp, or gravity. The substrate is cooled, e.g., below 25° C., by chuck 106, while the interior surfaces of chamber 100 are heated, e.g., above 50° C., by temperature controller 126. Gas, such as helium, is supplied to the back side of the substrate from gas source 118 and aperture 108, to improve the heat transfer from chuck 106 to the substrate and control deposition on substrate backside.

One or more reactive gases are supplied to the interior of chamber 100 from reactive gas supply 114 and showerhead 102. The reactive gas flows through small holes in face plate 104 and over the surface of the substrate. One deposition option uses RF power supplied by RF power source 124 to chuck 106, while grounding showerhead 102. Typically, RF power source generates 200 watts at a frequency of 13.56 MHz, which produces an electromagnetic field between showerhead 102 and chuck 106. The electromagnetic field forms a plasma of the reactive gas flowing through face plate 104 so that deposition may occur. For example, during parylene deposition RF power source 124 is used to generate a plasma to deposit a parylene adhesion layer. Once the parylene adhesion layer is generated, the RF power is turned off, and the remaining parylene deposition occurs. A second deposition option does not use RF power. Vacuum pump 112 is used to pump out the excess gas within chamber 100 through annular pumping port 110 so that a constant pressure is maintained within chamber 100.

As a result of the processing of the substrate, contaminants are deposited on the interior surfaces of chamber 100. Moreover, during certain types of processing, such as deposition of parylene polymer, contaminants are deposited on the interior surfaces of showerhead 102. The interior surfaces of showerhead 102 typically show a higher deposition rate than the walls of chamber 100 because the temperature of showerhead 102 is typically lower than the temperature of the walls. Periodically an in situ cleaning cycle is used to remove the contaminates within chamber 100. The in situ cleaning cycle can be used when it is determined necessary by inspection of the deposited substrate film for contamination, or may be performed at regular intervals such as after a predetermined thickness of film has been deposited, e.g., 10 $\mu$m (micrometers).

Figure 2:
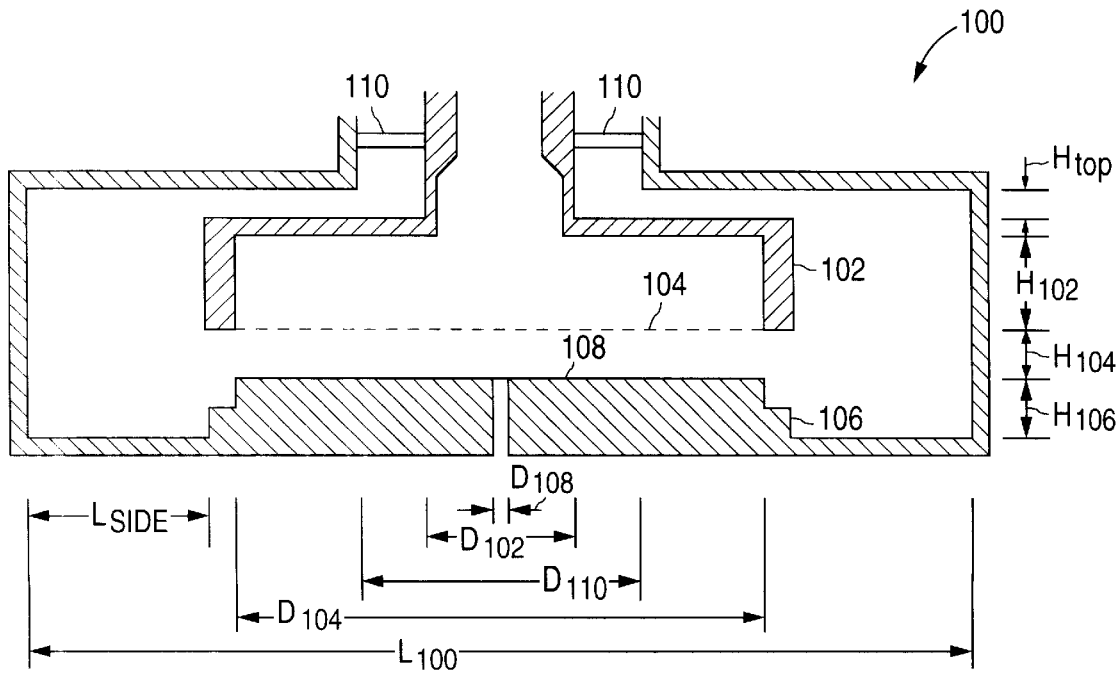
FIG. 2 is a side view of a processing chamber used in accordance with one embodiment of the present invention.

FIG. 2 is a side view of chamber 100 used in accordance with one embodiment of the present invention. As shown in FIG. 2, chamber 100 includes showerhead 102 with face plate 104, chuck 106 with aperture 108, and annular pumping port 110. The walls of chamber 100, including the surfaces of showerhead 102 are manufactured out of aluminum, or any similarly rigid, non-corrosive material. One example of chamber 100 is the parylene AF4 processing chamber model manufactured by Novellus Systems, Inc. located in San Jose, Calif., which includes aperture 108, and injects a cleaning gas through aperture 108.

Chuck 106 is a conventional electrostatic chuck for a 200 mm wafer, which uses an electric charge to clamp the wafer to the surface of chuck 106. Filelrs around the parameter of chuck 106 may be used when chamber 100 is designed for expansion to 300mm wafers. As discussed above, the aperture 108 chuck 106 is used during processing to supply helium or other similar gas to the back side of the wafer to aid in heat transfer and control substrate backside deposition. The use of chuck 106 to supply a gas to control substrate backside deposition is described in detail in U.S. Pat. App. Ser. No. 08/938,206, filed on Sep. 26, 1997, now U.S. Pat. No. 6,063,202 issued on May 16, 2000, having the same assignee and is incorporated herein by reference. Of course, chuck 106 is not limited to an electrostatic chuck or to a chuck sized for only a 200 mm wafer.

Showerhead 102 is likewise sized for a 200 mm wafer, but of course the size of showerhead 102 may be altered to accommodate other size wafers if desired. Face plate 104 of showerhead 102 has a plurality of uniformly spaced small diameter holes that permit the parylene monomer gas to flow through face plate 104 during processing. Face plate 104, by way of an example, has approximately 8,407 uniformly distributed holes, each of which is 1.5 mm in diameter.

As shown in FIG. 2, chamber 100 has an internal length $L_{100}$ of approximately 350 mm, and an internal height $H_{100}$ of approximately 110 mm. Face plate 104 and the top surface of chuck 106 have a diameter $D_{104}$ of approximately 208 mm. Annular pumping port 110 has a diameter $D_{110}$ of approximately 98 mm, and the portion of showerhead 102 that extends through annular pumping port 110 has a diameter $D_{102}$ of approximately 46 mm. The distance $L_{side}$ between an interior side wall of chamber 100 and the largest diameter of showerhead 102 is approximately 62 mm. The diameter $D_{108}$ of aperture 108 is 4 mm.

The height $H_{106}$ of chuck 106 is approximately 28 mm, while the distance $H_{104}$ between the top surface of chuck 106 and the bottom surface of face plate 104 is approximately 26 mm. The distance $H_{102}$ between the top surface of face plate 104 and the interior surface of showerhead 102 is approximately 36 mm. The distance $H_{top}$ between the top surface of showerhead 102 and the interior top wall of chamber 100 is approximately 11 mm.

It should be understood, of course, that the above dimensions are illustrative and are not intended as limiting. Thus, chamber 100 may have any dimensions that permit the desired flow of cleaning gas from aperture 108 through chamber 100.

Figure 3A:
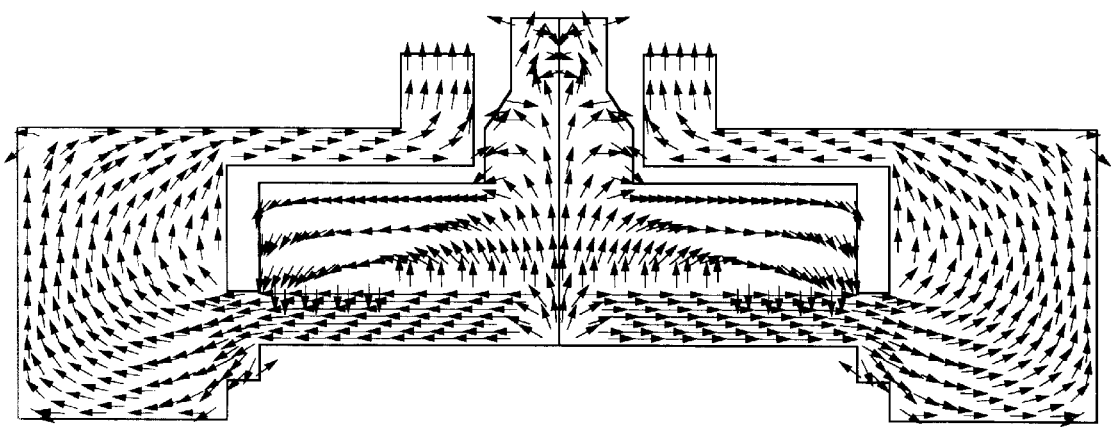
FIGS. 3A, 3B, and 3C are side views of a Fluent model of a processing chamber showing the flow patterns in the chamber at 0.7 Torr, where the gaseous cleaning agent flows through the aperture at 10 sccm, 30 sccm, and 50 sccm, respectively.
Figure 3B:
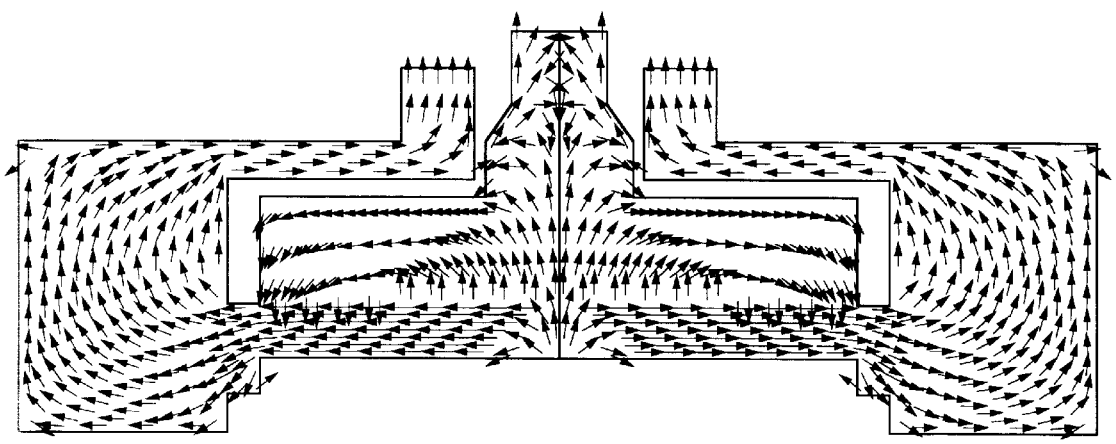
Figure 3C:
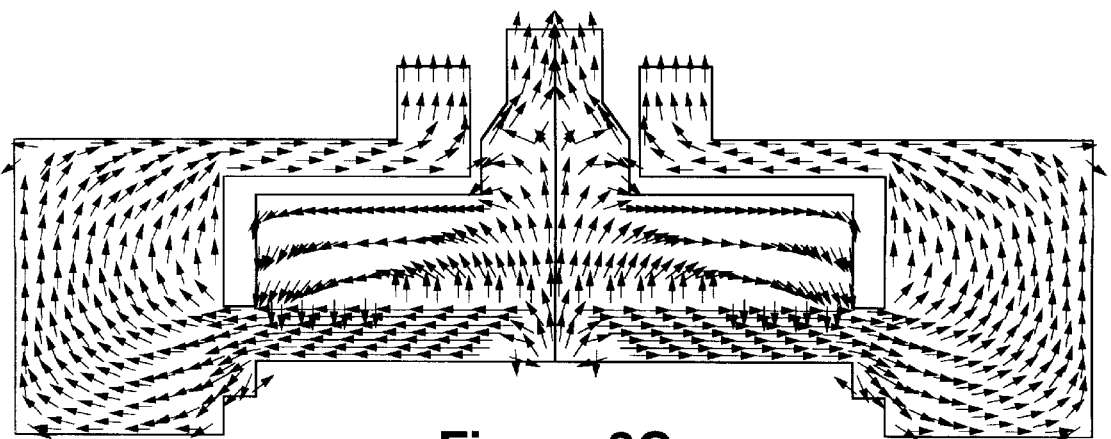

FIGS. 3A, 3B, and 3C are side views of chamber 100 showing the flow patterns in chamber 100 at 0.7 Torr, where the cleaning gas is flowing through aperture 108 at 10 standard cubic centimeters per minute (sccm), 30 sccm, and 50 sccm, respectively, and no gas is being pumped into chamber 100 via showerhead 102. FIGS. 3A, 3B, and 3C were modeled in Fluent UNS version 4.3 from Fluent Inc., located in Lebanon, N.H., using a two dimensional model of chamber 100 where showerhead 102 and chuck 106 were both sized for a 200 mm wafer, and showerhead 102 and walls of chamber 100 were assumed to be 50° C. and chuck 106 is at 0° C. The face plate 104 of showerhead 102 has 8407 holes of 0.06 inches in diameter and was treated as a porous media with a permeability of 1.75 E-8 $m^2$. The cleaning gas was assumed to be Oxygen $O_2$ with a thermal conductivity K of 0.024 w/m-K and a viscosity $\mu$ of 1.79 E-5 kg/m-s.

As can be seen in FIGS. 3A, 3B, and 3C, the cleaning gas leaves aperture 108 at a fairly high velocity, e.g., 4 to 21 meters per second, and impinges on face plate 108. Most of the gas is deflected by face plate 108 and flows radially outward in chamber 100. A small portion of the gas, however, flows through face plate 104, circulates within showerhead 102, and flows back out of face plate 104. The flow patterns at the different flow rates, i.e., 10 sccm 30 sccm and 50 sccm are all similar except for the recirculation that forms around aperture 108 at higher flow rates. Of course if chuck 106 had more than one aperture providing cleaning gas to chamber 100, the flow pattern will vary from what is shown in FIGS. 3A, 3B, and 3C.

Figure 4A:
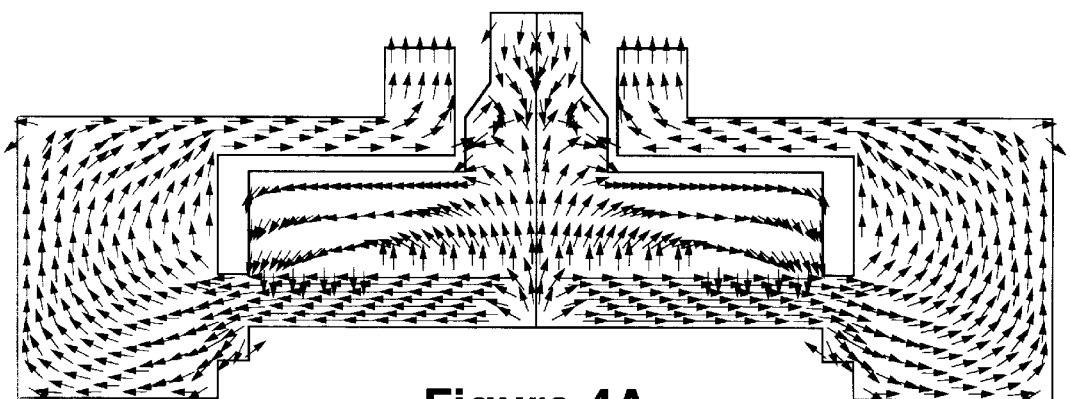
FIGS. 4A, 4B, and 4C are side views of modeling of a processing chamber showing the flow patterns in the chamber at 1.0 Torr, where the gaseous cleaning agent flows through the aperture at 10 sccm, 30 sccm, and 50 sccm, respectively.
Figure 4B:
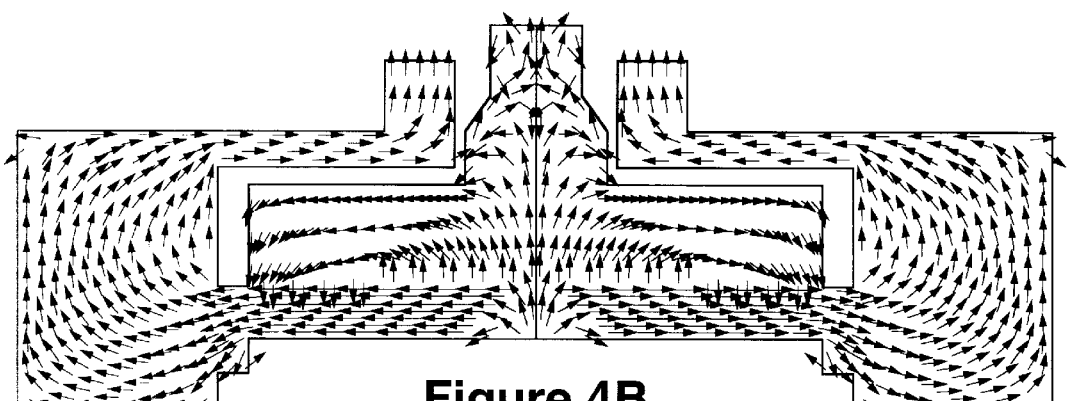
Figure 4C:
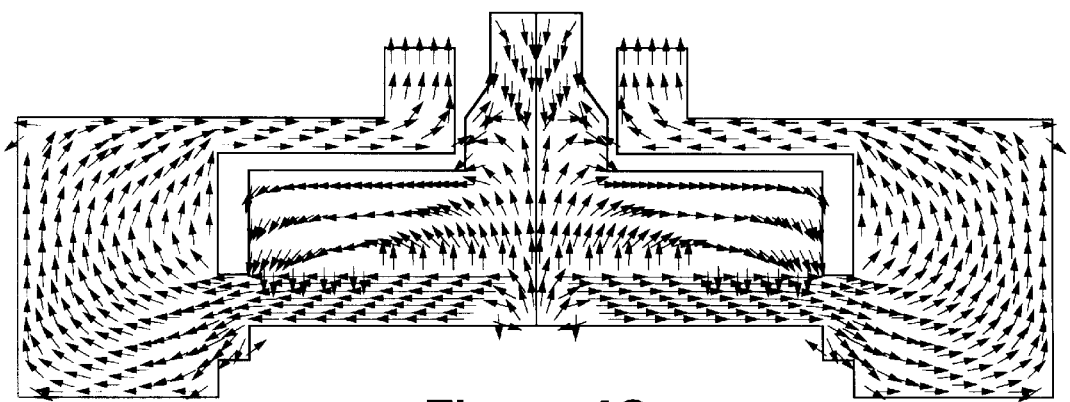

FIGS. 4A, 4B, and 4C are side views of chamber 100 showing the flow patterns in chamber 100 at 1.0 Torr, where the cleaning gas is flowing through aperture 108 at 10 standard cubic centimeters per minute (sccm), 30 sccm, and 50 sccm, respectively. The flow patterns shown in FIGS. 4A, 4B, and 4C were generated in the same manner as that described in reference to FIGS. 3A, 3B, and 3C, except that the pressure of chamber 100 is increased to 1.0 Torr. As can be seen by comparing FIGS. 3A, 3B, and 3C with FIGS. 4A, 4B, and 4C, changing the pressure in chamber 100 from 0.7 Torr to 1.0 Torr has no apparent effect on the flow patterns.

Figure 5:
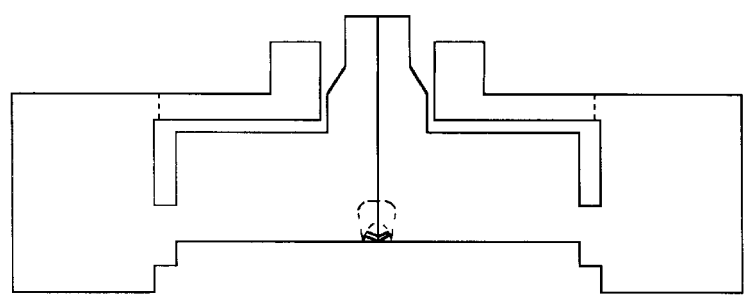
FIG. 5 is a side view of chamber showing the pressure distribution within the chamber at 1.0 Torr with the gaseous cleaning agent flowing at 50 sccm, as shown in FIG. 4C.

Pressure affects the volume within chamber 100 that becomes a plasma during application of the RF power. A high pressure constrains the plasma to the area near aperture 108, and a low pressure permits the volume of the plasma to expand. FIG. 5 is a side view of chamber 100 showing the pressure distribution within chamber 100 for the 1.0 Torr, 10 sccm flow case, i.e., the flow pattern shown in FIG. 4A. The pressure distribution in chamber 100 is indicated by dotted isobars. As can be seen, there is a relatively constant pressure distribution throughout chamber 100, with a high pressure region near aperture 108 and a low pressure region near annular pumping port 110. However, the high pressure region near aperture 108 is only 0.6 mTorr, which is small compared to the total pressure of 1.0 Torr within chamber 100. Thus, the pressure distribution caused by the cleaning gas injection from aperture 108 will have little consequence on the volume of the plasma or the structural integrity of chamber 100. Nevertheless, the presence of the pressure distribution shown in FIG. 5 indicates that the gas will flow from the high pressure region to the low pressure region within chamber 100.

The in situ cleaning process for chamber 100 is the following. The gas sources 114 and 118 are isolated from chamber 100 by closing valves 116 and 122, respectively. Vacuum pump 112 then pumps remaining gas out of chamber 100 via annular pumping port 110, until chamber 100 is at its base pressure, e.g., 10 mTorr. The substrate or substrates are removed from chamber 100.

Valve 123 opens to permit cleaning gas source 120 to fill chamber 100 with a cleaning gas, such as Oxygen $O_2$, via aperture 108 while vacuum pump 112 continues to pump gas out of chamber 100. Because the cleaning gas is injected into chamber 100 from aperture 108, which is directly below face plate 104, some of the cleaning gas passes through face plate 104 and into showerhead 102. Cleaning gas source 120 supplies the cleaning gas faster than vacuum pump 112 can drain the gas out of chamber 100, until a desired pressure is achieved within chamber 100, such as 0.5 to 3.0 Torr. The pressure within chamber 100 is then stabilized by appropriately regulating the rate that the cleaning gas is supplied to chamber 100 from gas supply 120 via valve 123, and the rate at which the gas is pumped out of chamber 100 by vacuum pump 112 via annular pumping port 110. Multiple pressures may be used, for example 500 mTorr and 1 Torr, which permits different areas of the chamber to be cleaned. As described in reference to FIG. 5, changes in pressure will alter the focus of plasma: a high pressure constrains the plasma between chuck 106 and showerhead 102, while a low pressure permits the plasma to expand throughout chamber 100.

Once the pressure conditions are stabilized within chamber 100, the RF power source 124 supplies RF power to chuck 106 while the cleaning gas continues to flow into chamber 100 through aperture 108. The RF power source 124 during cleaning generates 100 to 1000 watts at a frequency of 13.56 MHz, which produces an electromagnetic field between showerhead 102 and chuck 106. Typically, during cleaning, 300 watts is generated by RF power source 124 in a chamber with the dimensions as disclosed in reference to FIG. 2. The wattage of RF power source 124 may vary, however, depending on the dimension of chamber 100 and the pressures being used. The electromagnetic field forms a plasma of the cleaning gas. Thus, where Oxygen ($O_2$) is used, a plasma gas containing Oxygen ions is generated. Vacuum pump 112 pumps reactant gases out of chamber 100 through annular pumping port 110 such that a constant pressure and a stable plasma is maintained within chamber 100.

The Oxygen ions chemically react with the contaminants on the interior surfaces of chamber 100 to form gaseous by-product, i.e., vapor, and particles of the contaminant that are pumped out of chamber 100 via annular pumping port 110 and vacuum pump 112.

Because the cleaning gas is injected into chamber 100 from aperture 108, the cleaning gas interacts with the RF electromagnetic field between showerhead 102 and chuck 106 to form ions before passing through face plate 104. Thus, the cleaning Oxygen ions are circulated within showerhead 102 to react with any contaminants within showerhead 102 to form vapor and particles. The vapor and particles then flow out through face plate 104 and out of chamber 100 via annular pumping port 110.

After cleaning chamber 100 at one pressure, if desired, a second pressure may be used. Thus, the rate of flow of the cleaning gas and the rate of pumping out chamber 100 are altered until the desired second pressure is obtained. The cleaning process then continues at the second pressure. By using multiple pressures, different areas of chamber 100 are cleaned. A high pressure, e.g., 1 Torr, is used to effectively clean the face plate 104, the surface of chuck 106, and advantageously the interior of showerhead 102, while a lower pressure, e.g., 500 mTorr, is used to clean the remainder of chamber 100.

After chamber 100 has been cleaned by the reactant gas, e.g., after approximately 5 to 60 minutes, RF power source 124 turns off the RF power to chuck 106 and valve 123 closes to stop the flow of cleaning gas from cleaning gas source 120. Valve 116 opens to permit a purging gas from gas source 114 to be introduced into chamber 100 through showerhead 102 while vacuum pump 112 continues to pump the gas out of chamber 100 through annular pumping port 110. Valve 116 is turned off to shut off the flow of purging gas and chamber 100 is brought down to its base pressure, below 10 mTorr, by vacuum pump 112. The desired gases are then introduced into chamber 100 via showerhead 102 and the processing of substrates is resumed.

Although the present invention has been described in considerable detail with reference to certain versions thereof, other versions are possible. For example, the present invention may be embodied in a chamber with a plurality of chucks and showerheads and/or in a chamber that performs a type of processing other than parylene deposition. The particular gaseous cleaning agent may also be varied according to the desired application. A processing chamber in accordance with an embodiment of the present invention may use a gaseous cleaning agent that does not form a plasma. Further, the RF power may be applied in different manners, such as by a coil located between aperture 108 and face plate 104. Therefore, the spirit and scope of the appended claims should not be limited to the description of the versions depicted in the figures.

What is claimed is:

1. A processing chamber comprising:

a showerhead having a porous face plate;

a cleaning gas supply coupled to a first valve;

a second gas supply coupled to a second valve;

a chuck positioned below said showerhead, said chuck having at least one aperture, said at least one aperture coupled to said cleaning gas supply via said first valve and coupled to said second gas supply by said second valve, said at least one aperture located to direct a flow of said cleaning gas into said processing chamber, wherein a portion of said cleaning gas flows through said face plate and into said showerhead; and a pumping port for draining said cleaning gas out of said processing chamber, said pumping port coupled to a vacuum pump.

2. The processing chamber of claim 1, wherein said pumping port is an annular pumping port around said showerhead.

3. The processing chamber of claim 1, wherein said processing chamber is coupled to an RF power source, said RF power source producing an electromagnetic field within said chamber.

4. The processing chamber of claim 3, wherein said cleaning gas forms an ionizing plasma in said electromagnetic field and wherein said portion of said cleaning gas flowing through said face plate are cleaning gas ions.

5. The processing chamber of claim 3, wherein said chuck is coupled to said RF power source and said showerhead is coupled to ground, said RF power source producing an electromagnetic field between said showerhead and said chuck.

6. The processing chamber of claim 1, wherein said showerhead is coupled to a purge gas supply.

7. The processing chamber of claim 1, wherein said chuck, said showerhead, and the walls of said processing chamber are coupled to a temperature regulator.

8. The processing chamber of claim 1, wherein said cleaning gas comprises Oxygen.

9. The processing chamber of claim 1, wherein said at least one aperture is centrally located in said chuck.

10. The processing chamber of claim 9, wherein said at least one aperture is one apertare centrally located in said chuck.

11. A processing chamber comprising:

a showerhead having a porous face plate;

a supply of gaseous cleaning agent;

a supply of a second gas;

a chuck positioned under said face plate;

means for providing a flow of said second gas from said chuck into said processing chamber;

means for providing a flow of said gaseous cleaning agent from said chuck, through said face plate and into said showerhead; and a pumping port for draining said gaseous cleaning agent from said processing chamber.

12. The processing chamber of claim 11 wherein said means for providing a flow comprises an aperture in said chuck positioned under said face plate, said at least one aperture coupled to said supply of gaseous cleaning agent through a first valve, said at least one aperture providing a flow of a gaseous cleaning agent into said processing chamber, wherein a portion of said flow of a gaseous cleaning agent flows through said face, plate into said showerhead and wherein said means for providing a flow of said second gas from said chuck into said processing chamber comprises said at least one aperture coupled to said second gas through a second valve.

13. The processing chamber of claim 12, further comprising a power supply, said chuck and said showerhead are coupled to said power supply, wherein said power supply forms an ionizing plasma from said gaseous cleaning agent, said portion of said flow of a gaseous cleaning agent flowing through said face plate comprising ions.

14. The processing chamber of claim 12, wherein said aperture is centrally located in said chuck.

15. The processing chamber of claim 11, wherein said gaseous cleaning agent comprises Oxygen.

* * * * *